United States Patent
Baselmans (10) Patent No.: US 7,333,175 B2
(45) Date of Patent: Feb. 19, 2008

(54) METHOD AND SYSTEM FOR ALIGNING A FIRST AND SECOND MARKER

(75) Inventor: Johannes Jacobus Matheus Baselmans, Oirschot (NL)

(73) Assignee: ASML Netherlands, B.V., Veldhoven (NL)

( * ) Notice: Subject to any disclaimer, the term of this patent is extended or adjusted under 35 U.S.C. 154(b) by 174 days.

(21) Appl. No.: 11/014,223

(22) Filed: Dec. 17, 2004

(65) Prior Publication Data

US 2006/0055904 A1 Mar. 16, 2006

Related U.S. Application Data

(60) Provisional application No. 60/609,186, filed on Sep. 13, 2004.

(51) Int. Cl.
G03B 27/52 (2006.01)
G03B 27/42 (2006.01)

(52) U.S. Cl. .......................................... 355/55; 355/53

(58) Field of Classification Search ................... 355/53, 355/55, 77; 356/399, 400, 401; 430/311
See application file for complete search history.

(56) References Cited

U.S. PATENT DOCUMENTS

| 4,991,962 | A | * | 2/1991 | Jain | ............................ 356/490 |
|---|---|---|---|---|---|
| 5,596,413 | A | * | 1/1997 | Stanton et al. | ............... 356/401 |
| 6,097,473 | A | * | 8/2000 | Ota et al. | .................... 356/401 |
| 6,417,922 | B1 | * | 7/2002 | Dirksen et al. | ............. 356/401 |
| 2002/0122163 | A1 | * | 9/2002 | Inoue | ........................... 355/55 |
| 2003/0081213 | A1 | * | 5/2003 | Oishi et al. | .................. 356/401 |
| 2003/0090642 | A1 | * | 5/2003 | Osakabe et al. | .............. 355/53 |
| 2004/0211922 | A1 | * | 10/2004 | Kroon et al. | ............. 250/492.2 |
| 2004/0233411 | A1 | * | 11/2004 | Shiraishi | ....................... 355/67 |

* cited by examiner

Primary Examiner—Henry Hung Nguyen
(74) Attorney, Agent, or Firm—Pillsbury Winthrop Shaw Pittman LLP (57) ABSTRACT

According to one embodiment, a method for aligning a first alignment marker with respect to a second alignment marker, a lens being positioned in between the markers, includes providing an alignment beam and imaging the first alignment marker on the second alignment marker with the alignment beam through the lens. A lens interferometer is provided as a measurement device arranged to measure a relative position of at least one of the first and second alignment markers. The method further includes measuring the relative position and aligning the position of at least one of the first and second alignment markers based on the measured relative position.

30 Claims, 6 Drawing Sheets

METHOD AND SYSTEM FOR ALIGNING A FIRST AND SECOND MARKER

RELATED APPLICATION

This application claims benefit of U.S. Provisional Patent Application No. 60/609,186 filed Sep. 13, 2004, which application is hereby incorporated by reference.

FIELD OF THE INVENTION

The present invention relates to lithographic apparatus and methods and device manufacturing methods.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus-described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate, processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support may include mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example, with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory actions may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In order to accurately apply a desired pattern onto a target portion of a substrate, the reticle should be aligned with respect to the substrate. Therefore, according to the prior art, the relative position of the reticle with respect to the substrate is set accurately, by measuring and adjusting the relative position. Alignment of the patterning structure with respect to the substrate is, according to the state of the art, for instance done using two alignment actions.

In the first action the substrate is aligned with respect to the substrate stage carrying the substrate, while in the second action the reticle is aligned with respect to the substrate stage. As a result of these two actions, the reticle is aligned with respect to the substrate, as desired.

In case a single stage machine is used, the first and second action are carried out at the exposure position. In case a dual stage machine is used, the first action may be carried out at a first position, remote from the exposure position. Then, the substrate stage with the substrate positioned on it is transported to the exposure position, where the second action is performed.

The first action may be carried out with two sensors. A first sensor measures the relative position of the substrate with respect to the substrate stage in x, y and $R_z$ directions, where the xy-plane is defined as the plane that is substantially parallel with the surface of the substrate, the x- and y-direction being substantially perpendicular with respect to each other. The z-direction is substantially perpendicular with respect to the x- and y-direction so $R_z$ represents a rotation in the xy-plane, about the z-direction. A more detailed description about this sensor is, for instance, provided in EP 0 906 590 B1. A second sensor, usually referred to as the level sensor, measures the height of the surface in dependence on locations on the substrate to be exposed, creating a height map and based on the determined heights, also determines the rotations about the x and y-axis: $R_x$, $R_y$.

Next, in the second action, the reticle is aligned with respect to the substrate stage. This may be done with an image sensor, such as a transmission image sensor (TIS), as will be known to a person skilled in the art. A TIS measurement is performed by imaging a first alignment pattern provided on the reticle (mask alignment mark) through the projection system (lens) to a second alignment pattern provided on the substrate stage. The alignment patterns comprise a number of isolated lines. Inside the substrate stage, behind the second alignment pattern a light sensitive sensor is provided, e.g. a diode, that measures the light intensity of the imaged first alignment pattern. When the projected image of the first alignment pattern exactly matches the second alignment pattern, the sensor measures a maximum intensity. The substrate stage is now moved in the x- and y-direction on different z-levels, while the sensor measures the intensity. Therefore, the TIS is actually an aerial image sensor, in which multiple scanning slits probe the aerial image of isolated lines. Based on these measurements, an optimal relative position of the substrate stage can be determined. The TIS sensor will be explained in further detail below with reference to FIG. 2. It will be understood that instead of a transmission image sensor, also a reflective image sensor may be used. In this case the second alignment pattern provided on the substrate stage is reflective, and the light sensitive sensor is not positioned inside the wafer stage. Therefore it will be understood that although the text refers to transmission image sensors, this may in general be any type of image sensor.

However, the inventors have discovered that the use of TIS measurements involves a few disadvantages. The position of the isolated lines is defined by the reticle, the illumination mode applied and the lens aberrations. The first and second alignment patterns have different structures and dimensions than the features of the patterning structure to be imaged on the substrate. The features of the patterning structure may have a different aligned position than the alignment pattern, e.g. due to a different response to lens aberrations. Thus, the lens may treat them differently, i.e. may project the alignment pattern on a different location than the structure of the patterning structure. This may cause an offset in the aligned position, in the lateral direction (in x, y plane) as well as in the axial direction (z-direction).

An alignment sequence usually consists of multiple single point alignments. The result of a single point alignment equals an aligned position x, y and z. When multiple points are aligned, the rotation can be computed based on the relative positions between the points. Since aberrations differ for different positions, the single point alignment by TIS is influenced differently for different positions. So, offsets in all parameters may be expected.

It is also possible to perform the alignment in one action, instead of in two actions as described above. In such a single step alignment scheme, the reticle is directly aligned with respect to the substrate. This is done using a through-the-lens alignment system measuring in the x, y and $R_z$ directions, of which a more detailed description is provided in EP 1 026 550 A2.

As already stated above, the aligned position measured by TIS is influenced by lens aberrations. When increasing the resolution of a lithographic system without changing numerical aperture (NA) and wavelength, new illumination modes are introduced (e.g. low k1 factor). These modes have in common that the light is coming from a limited number of small angles (poles). As example, dipole illumination illuminates the reticle under two angles with very small opening angles. These types of illumination modes also have a very discrete use of the lens NA. Using such different illumination mode types may further add to inaccurate alignment.

During exposure, the lens of the projection system will heat up, as a result of energy absorbed from the projection beam. Since a heated lens may have different optical characteristics, the lens aberration may change. The calibrated alignment is no longer valid, since it was performed using a 'cold' lens. Also this may add to inaccurate alignment.

SUMMARY

According to one embodiment, a method of aligning a first alignment marker with respect to a second alignment marker comprises using an alignment beam and a lens positioned in a path of the alignment beam between the first alignment marker and the second alignment marker, imaging the first alignment marker on the second alignment marker; using a lens interferometer to measure a relative position of the second alignment marker relative to the first alignment marker; and based on the measured relative position, aligning a position of at least one of the first and second alignment markers.

According to another embodiment, a system for aligning a first alignment marker with respect to a second alignment marker comprises a lens arranged to image the first alignment marker on the second alignment marker, said lens being positioned in a path of an alignment beam between the first alignment marker and the second alignment marker; a lens interferometer arranged to measure a relative position of the first alignment marker relative to the second alignment marker; and a control system arranged to align a position of at least one of the first and second alignment markers based on the measured relative position.

According to a further embodiment, a method of aligning comprises illuminating a first alignment marker with a beam; using a lens to project light of the beam outgoing from the first alignment marker onto a second alignment marker;

obtaining information regarding at least one aberration of the lens from light of the beam outgoing from the second alignment marker; and based on the information, measuring a position of at least one of the first and second alignment markers with respect to the other.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the description and drawings, the same references are used for the same objects.

DETAILED DESCRIPTION

Embodiments of the present invention include apparatus and methods that may be applied to reduce the influence of lens aberrations on alignment measurements.

Figure 1:
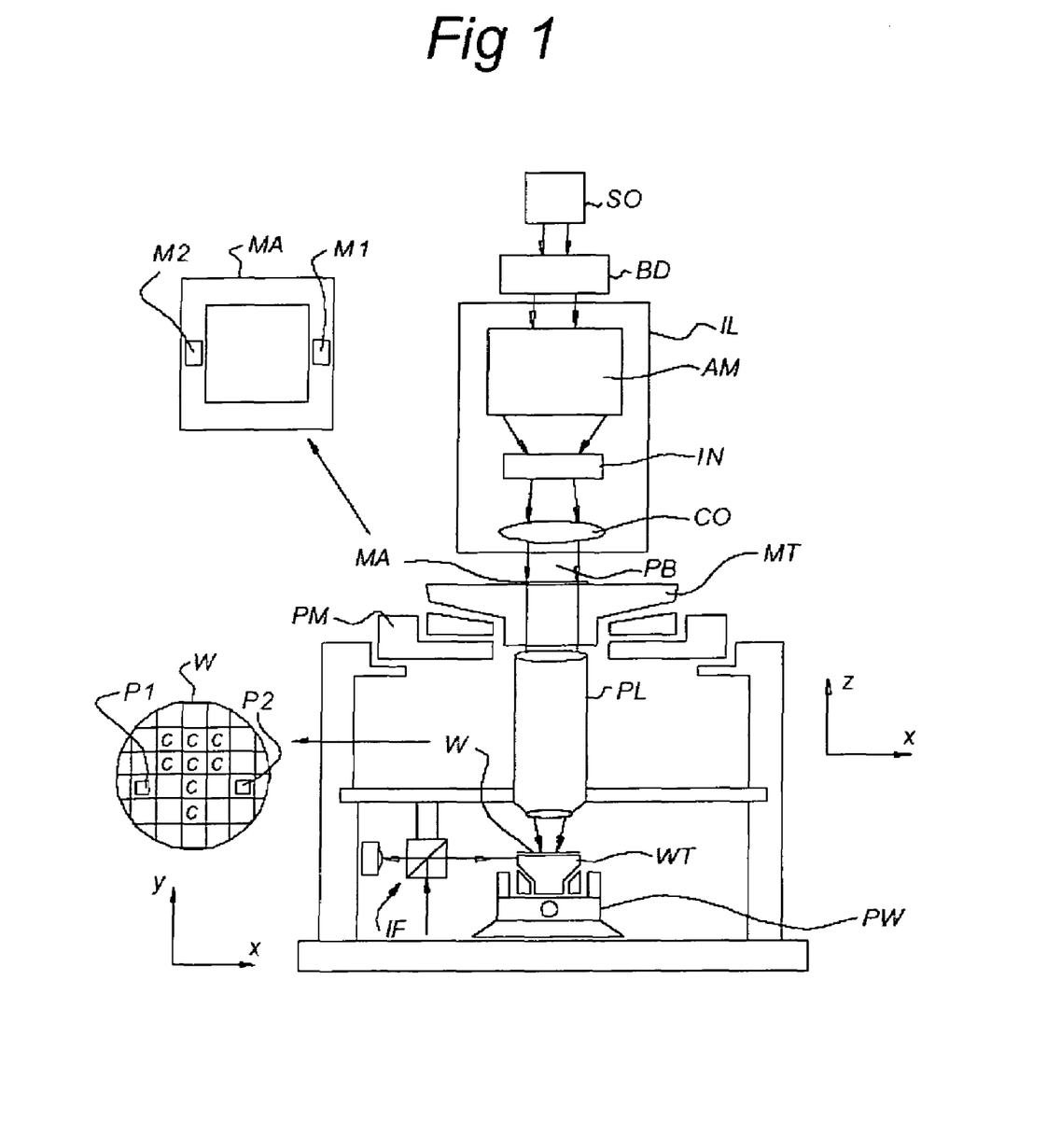
FIG. 1 depicts a lithographic apparatus according to an embodiment of the invention.

FIG. 1 schematically depicts a lithographic apparatus according to a particular embodiment of the invention. The apparatus may include an illumination system (illuminator) IL for providing a projection beam PB of radiation (e.g. UV radiation or EUV radiation); a first support structure (e.g. a mask table) MT for supporting patterning structure (e.g. a mask) MA and connected to first positioning device PM (e.g. including at least one rotary, linear, or planar motor) for accurately positioning the patterning structure with respect to item PL; a substrate table (e.g. a wafer table) WT for holding a substrate (e.g. a resist-coated wafer) W and connected to second positioning device PW for accurately positioning the substrate with respect to item PL; and a projection system (e.g. a refractive projection lens) PL for imaging a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system.

The illuminator IL may comprise adjusting structure AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW (e.g. including at least one rotary, linear, or planar motor) and position sensor IF (e.g. an interferometric or capacitive device and/or encoder), the substrate table WT can be moved accurately, e.g. so as to position different target portions C in the path of the beam PB. Similarly, the first positioning device PM and another position sensor (e.g. an interferometric or capacitive device and/or encoder, which is not explicitly depicted in FIG. 1) can be used to accurately position the mask MA with respect to the path of the beam PB, e.g. after mechanical retrieval from a mask library, or during a scan. In general, movement of the object tables MT and WT may be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment markers M1, M2 and substrate alignment markers P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

As discussed above, the alignment of the reticle MA with respect to the substrate W may be performed in two actions. First the substrate W may be aligned with respect to the substrate table WT, and in a second action the reticle MA may be aligned with respect to the substrate table WT. As a result of these two actions, the relative position of the reticle and the substrate may be known and may be optimally set, in order to ensure optimal imaging of the patterning structure.

At least some of the embodiments of the invention described herein may be applied to provide a solution to the problems associated with the second action, i.e. the alignment of the reticle MA with respect to the substrate stage WT. Therefore, the sensor that is conventionally used for this, the TIS sensor, is further explained with respect to FIG. 2.

Figure 2:
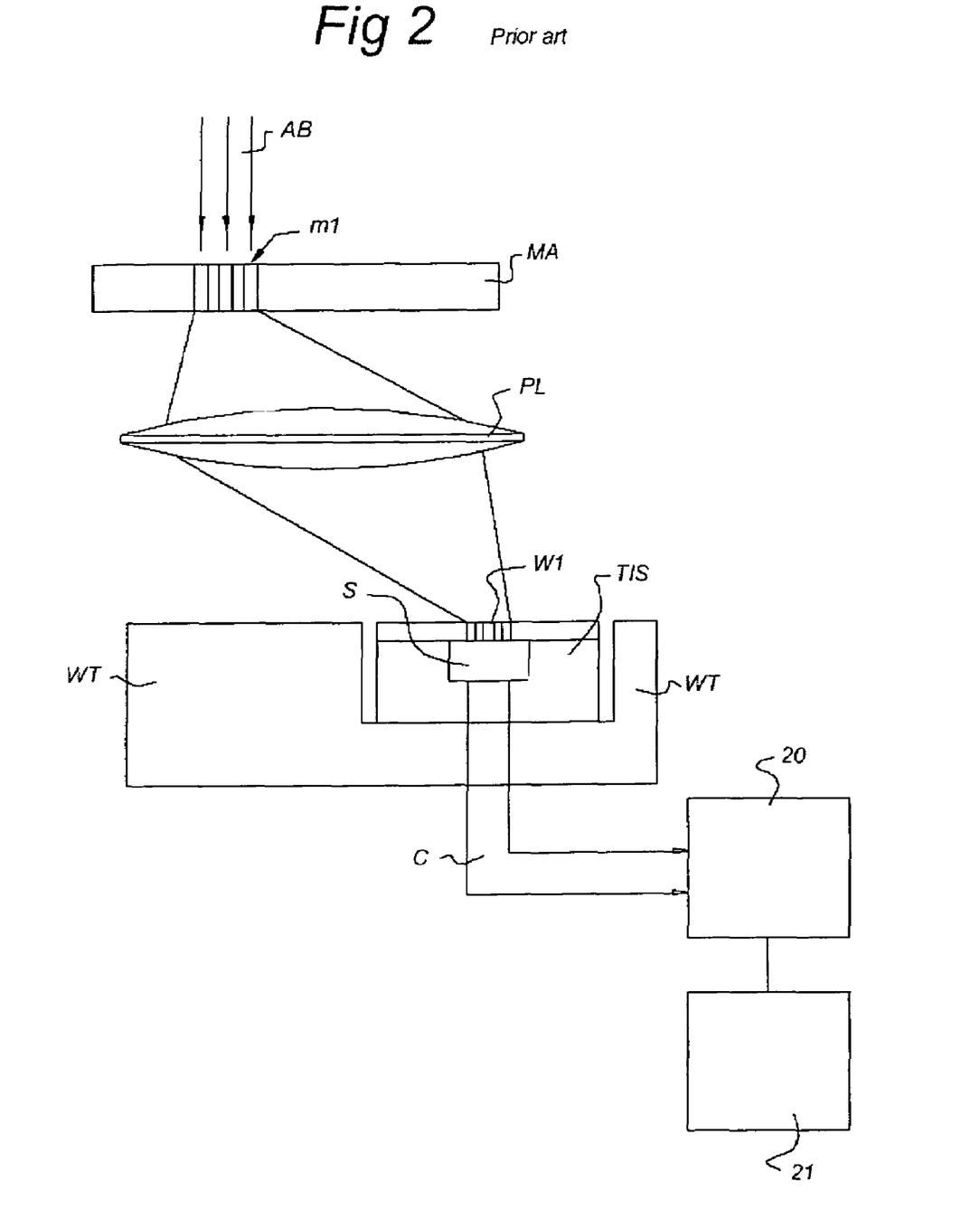
FIG. 2 depicts a transmission image sensor according to the state of the art.

FIG. 2 depicts a simplified, schematic view of a part of a TIS sensor. Same references symbols are used for the same objects as in FIG. 1.

FIG. 2 depicts the reticle MA provided with a mask alignment marker m1. The figure further shows the substrate table WT and the projection system PL, provided in between the reticle MA and the substrate table WT. The projection system PL is depicted as a single lens, but it will be understood that it may also be a plurality of lenses. The projection system PL will be referred to as the lens PL, for convenience sake.

The substrate table WT comprises the TIS-sensor, provided with a substrate table alignment marker W1. Behind the alignment marker W1 a light sensitive sensor S is provided, such as a diode. The sensor S may be provided with cabling C for communicating the measured data to a processor 20. The processor 20 is arranged to communicate with a memory device 21.

The alignment measurement is carried out by providing an alignment beam AB to the mask alignment m1 and imaging the mask alignment marker m1 via the lens PL on the substrate table alignment marker W1. The alignment beam AB preferably originates from the same radiation source SO (not shown in FIG. 2) as used for exposing the substrate W.

The substrate table alignment marker W1 is of a transmissive type and both markers m1, W1 have a predetermined corresponding pattern such that the pattern of the mask alignment marker m1 as projected on the substrate table alignment marker W1 by the lens PL and the pattern of the substrate table alignment mark W1 are matching. This means that a maximum amount of light is transmitted through the substrate table alignment marker W1 if the relative positioning of the reticle MA and the substrate table WT are correct. In that case, the sensor S will sense a maximum amount of light.

The alignment is now performed by moving the substrate table WT in all three directions (x, y, z), for instance by making a scanning movement in the x- and y-direction and performing these scans at different positions in the z-direction, while constantly measuring the light intensity as received by the sensor S. The movements of the substrate table WT are performed with the positioning device, such as the second positioning device PW as described with reference to FIG. 1 (not shown in FIG. 2). These positioning device PW are controlled by processor 20.

The position of the substrate table WT where the sensor S measures the maximum amount of light is considered to be the optimum relative position of the substrate table WT with respect to the reticle MA.

However, this alignment method has several disadvantages, as described above. In the first place the image of the alignment marker m I may be treated differently by the lens PL than the patterns used for exposure, since they have different dimensions. This may cause an offset in the aligned position, such as in the lateral direction (x, y) and the axial direction (z).

Also, during exposure, the lens PL may heat up as a result of energy absorbed from the projection beam PB. Since a heated lens may have different optical characteristics than a cold lens, the calibrated alignment may no longer be valid, since it was performed using a 'cold' lens.

Figure 3:
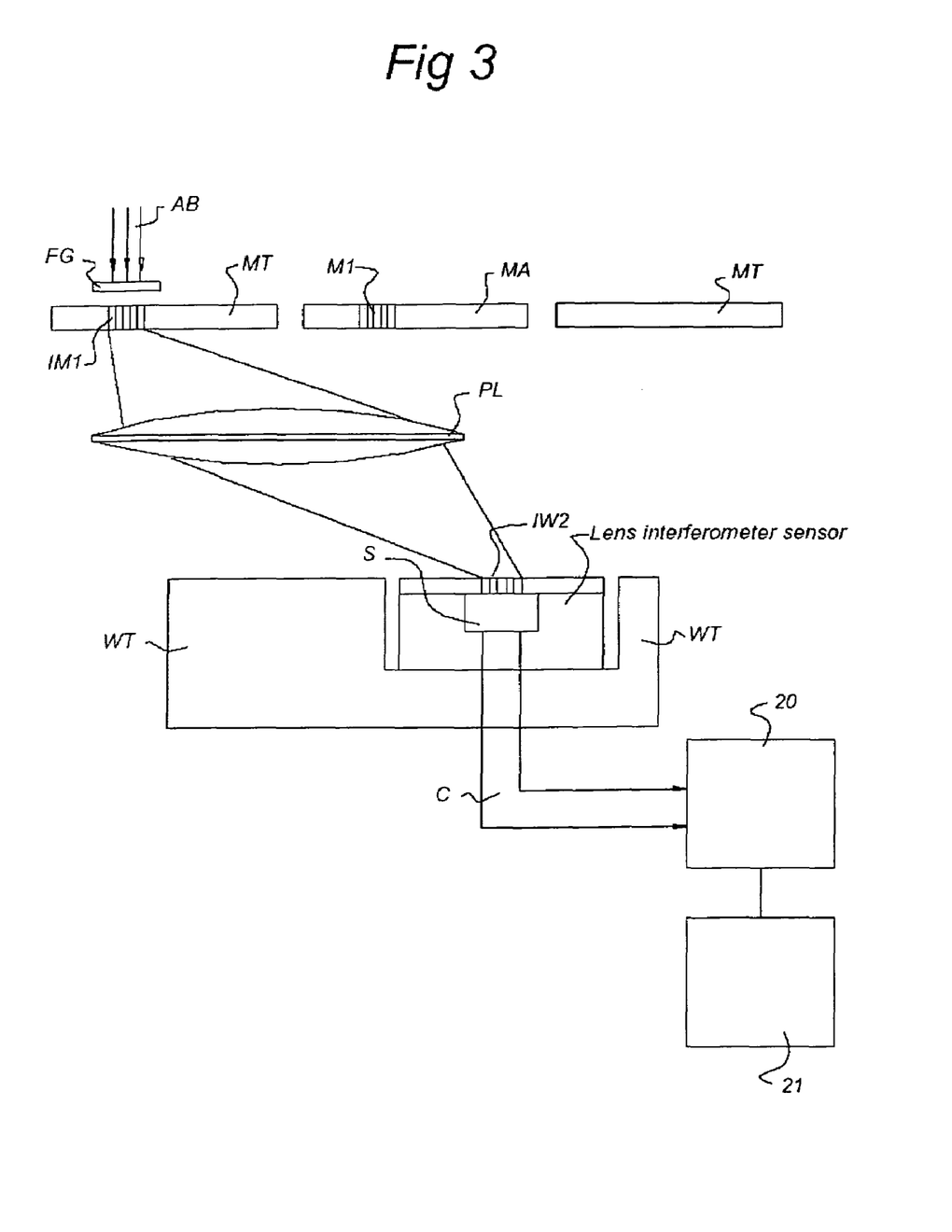
FIG. 3 depicts an alignment system according to an embodiment of the invention.

FIG. 3 schematically depicts a measurement system according to an embodiment of the invention. Same references are used in FIG. 3 as in FIG. 2 for indicating the same components. The measurement system depicted in FIG. 3 is referred to as a lens interferometer. Next to the reticle MA, the reticle stage MT is shown provided with a lens interferometer marker IM1 on reticle level.

According to this embodiment, the lens interferometer marker IM1 may be positioned on the reticle table MT. It will be appreciated, however, that this lens interferometer marker may also be positioned directly on the reticle.

It may be desirable to provide the whole pupil plane with light, e.g. in order to determine the phase at all positions in the pupil plane. Accordingly, above the lens interferometer marker IM1 on the reticle level in the path of propagation of alignment beam AB, there may be provided a diffuse element, for instance, a frosted glass FG. It will be appreciated that other elements may be used as diffuse elements, such as sand blasted elements, diffractive elements and holographic elements. In an alternative embodiment, sub-resolution pinholes may be used.

The frosted glass FG may be formed as an element of the reticle table or may be positioned close to the reticle table MT, but may also be positioned close to a conjugate field plane.

The measurement system according to the embodiment may further include a lens interferometer marker IW2 on substrate table WT. According to this embodiment the marker may be a transmissive marker. A 2D detector may be positioned behind the lens interferometer marker IW2 on substrate level (seen with respect to the propagation direction of the alignment beam AB). This detector S may detect the light at the image level and may be a camera.

The measurement system according to the embodiment may be used to measure lens aberrations per field point. This measurement system is based on the principle of shearing interferometry and may include a source module and a sensor module. The source module may have a patterned layer (lens interferometer marker IM1) of chromium that may be placed in the object plane of the projection system PL and may have additional optics provided above the chromium layer. The combination may provide a wavefront of radiation to the entire pupil of the projection system PL. The sensor module has a patterned layer of chromium (lens interferometer marker IW2) that is placed in the image plane of the projection lens PL and a camera (or 2D detector) that is placed some distance behind said layer of chromium IW2. The patterned layer of chromium IW2 on the sensor module diffracts radiation into several diffraction orders that interfere with each other giving rise to a interferogram. The interferogram is measured by the camera. The aberrations in the projection lens PL can be determined by software based upon the measured interferogram.

However, it will be understood that such an interferometer marker IW2 may also be of a reflective type. The lens interferometer marker IW2 may alternatively be positioned on the substrate W. In that case, preferably a reflective type is used.

Optical elements may be provided in between the substrate stage alignment marker IW2 and the sensor S.

The measurement arrangement may be a lens interferometer. In this embodiment, the lens interferometer may be a lens shearing interferometer. For example, "Optical Shop Testing (2nd edition)" by Daniel Malacara gives an overview of available lens interferometers (ISBN 0-471-52232-5). In general, one may state that a lens interferometer measures lens aberrations at a single field point. The lowest order aberrations (first order) are: wave front tilt and wave front curvature, which correspond to wave front displacements in the x, y and z direction with respect to the measurement location. Higher order wave front aberrations are: spherical aberration, coma, astigmatism, three-wave, five-wave etc.

Moreover, lens aberrations can be defined as aberrations with respect to a perfect spherical wave front. Such a perfect spherical wave front converges in a single point. In case this point corresponds with the detection point of detector S, the aberrations can be expressed as so-called Zernike polynomials. However, in case the point of convergence does not correspond with the detection point of detector S, these Zernike polynomials can still be defined. The lowest orders are a measure for the displacement of the wave front (i.e. tilt in x and y direction and the quadratic term).

So, in one embodiment the output of the sensor S includes a measure of the x, y, z position of the point of optimal focus (i.e. where the tilt and defocus Zernike polynomials are zero) and the lens aberrations at this point.

Figure 6A:
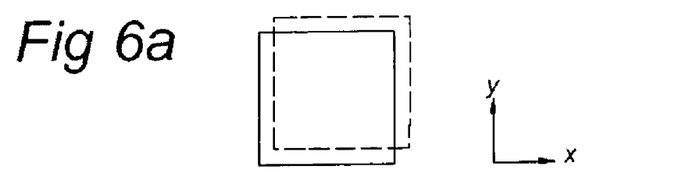
FIGS. 6a, 6b, 6c, 6d and 6e schematically depict different image distortions.

When compared to an alignment image sensor (like TIS) as described with reference to FIG. 2, a lens interferometer measures more and it also measures in a different way. An alignment image sensor (TIS) measures a displacement of the image only, as is schematically depicted in FIG. 6a. More than one such sensor may be used to measure other image distortions, e.g. as depicted in FIGS. 6b-e. But an alignment image sensor measures in a lithographic way (with use of specific test patterns). The image of these test patterns is also influenced by lens aberrations. For example, the XY-position is influenced by coma, and the Z-position is influenced by spherical aberration. A lens interferometer measures aligned position independent of the lens aberrations.

The lens interferometer may be used to determine the lens aberrations. A more detailed description of how this is done is given in WO 01/63233A2 and EP 123 15 17 A1.

The lens interferometer used according to the invention, is a lateral shearing interferometer, which has a close relation to a "Ronchi test". It is based upon interference between two identical (aberrant) wavefronts which are sheared (laterally translated) with respect to each other. The shearing is realized by placing a grating at the image plane (substrate level). So, two identical (aberrant) wave-fronts are interfering: the phase difference (wave-front difference) translates itself into an intensity difference.

The 2D interference pattern is detected by the sensor S, for instance a camera in the far field (or pupil plane) of this grating. So primarily, a sheared wavefront is measured (2D phase map). In order to enhance the detection accuracy, multiple sheared wavefronts are measured with a different object to grating alignment (phase stepping). This makes the intensity recorded to oscillate with the period of the grating. The phase-distribution of this signal equals the sheared wave-front.

A second sheared wavefront (in a more or less orthogonal shearing direction) is used to reconstruct the actual wavefront (the sheared wavefront measured is only a wave-front difference). An orthogonal polynomial expansion is performed on this actual wavefront. The coefficients of this expansion are the lens aberrations. The lowest orders correspond to the aligned position (x and y equal the tilt in orthogonal directions). The aberrations may be stored in memory device 21, that will be discussed below. The aligned position is independent of the illumination mode and the pattern of the reticle MA that is used.

The higher order aberrations (e.g. spherical aberration, coma aberration, astigmatism, threeleaf etc.) may also be stored in the memory device 21 and, for instance, may be used to qualify the projection lens, to adjust the projection lens, predict the displacement of the feature to be printed, etc.

According to the explanation above, it will be understood that the position of the reticle stage MT with respect to the substrate stage WT can be determined while the measurement errors due to lens aberrations are minimized.

It will be appreciated that the position of a printed lithographic pattern is determined by a number of lens aberrations. This position comprises a fixed component as measured by the lens interferometer discussed above, and by a variable component, for instance determined by the pattern to be printed, the illumination mode used etc. In case nothing is known about the variable component, the best alignment is given by the lowest Zernike polynomials as discussed above. In case additional information is known, such as the pattern to be printed, the illumination mode to be used and the higher order lens aberrations, the alignment may also take these factors into account.

Next, an alignment procedure of a reticle MA and a substrate W will be explained in case the alignment procedure is performed on a dual stage lithographic projection apparatus and lens interferometer sensors are used. The lithographic projection apparatus has a first position, the so-called measurement position. At the first position the measurements can be performed on the substrate W and the substrate table WT. This position is remote from a second position: the expose position. On the exposure position, the substrate W is exposed to a patterned projection beam PB. On the exposure position, also further measurements can be done.

Figure 4:
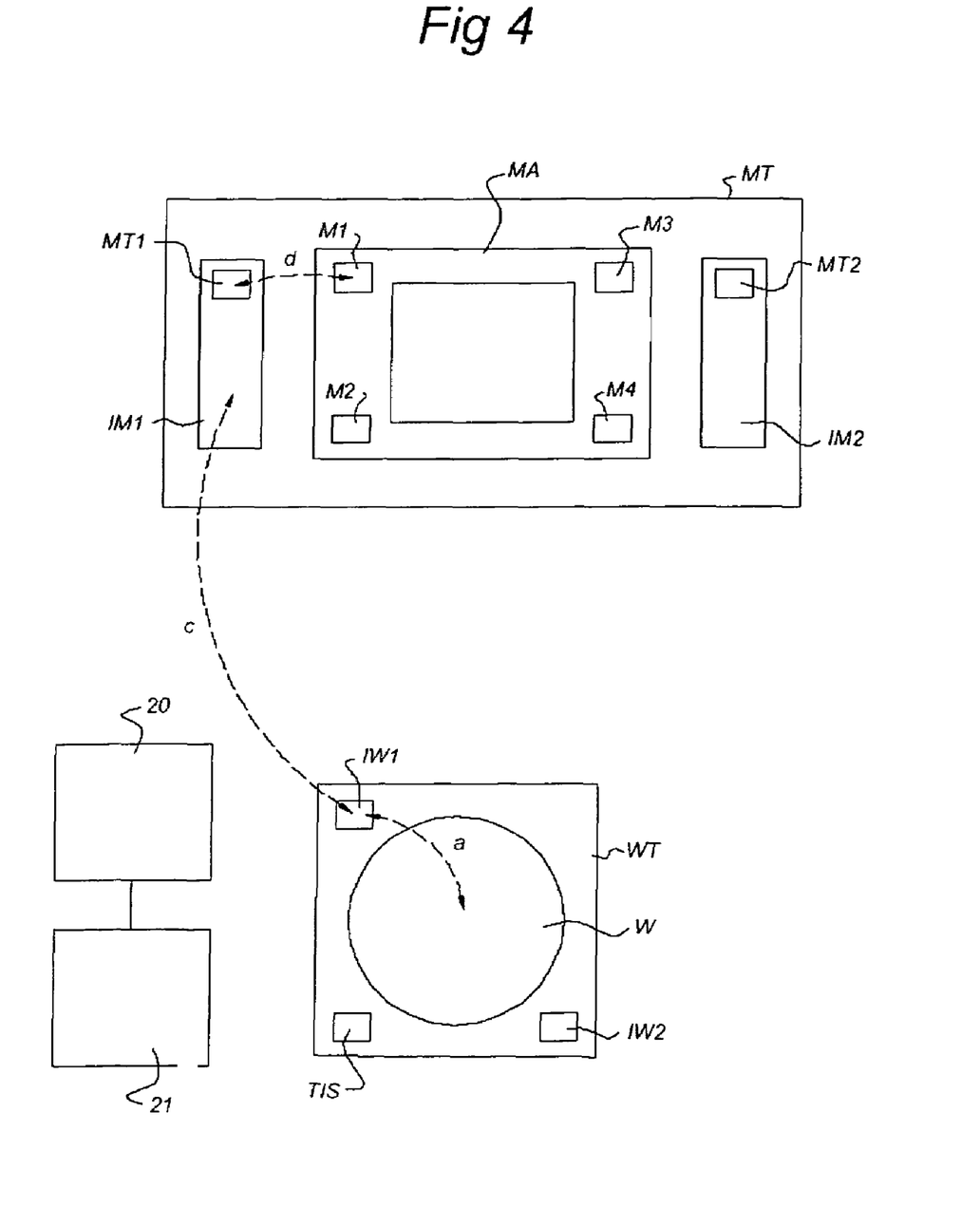
FIG. 4 schematically depicts an alignment method according to an embodiment of the invention.

The alignment procedure is explained with reference to FIG. 4, schematically showing a top view of the reticle stage MT and the substrate table WT, provided with a reticle MA and a substrate W, respectively. The substrate table WT may be provided with two lens interferometer sensors, positioned in the vicinity of lens interferometer markers IW1 and IW2 and the reticle table MT may be provided with two lens interferometer markers IM1 and IM2. The reticle may be provided with four mask alignment markers M1, M2, M3, M4.

Such an alignment procedure may include 4 actions:

a) align substrate W with respect to substrate table WT at the first position, b) move substrate stage WT to the second position, c) align substrate table WT with respect to reticle table MT, and d) align reticle MA with respect to reticle table MT.

These four actions will now be explained with reference to FIG. 5, in which the actions a, b, c and d are explained in more detail. It will be appreciated that this list of four actions is not a complete list of actions necessary for alignment, but that also additional actions may be performed, such as loading the reticle onto the reticle table and moving it to the exposure position.

a) Align Substrate W with Respect to Substrate Table WT at the First Position

In the first place, the substrate W can be positioned with respect to the substrate stage WT. This can be done in any way that is known according to the prior art, and may, for instance, be carried out with two sensors. A first sensor measures the relative position of the substrate W with respect to the substrate stage WT in the x, y and Rz direction, where the xy-plane is defined as the plane that is substantially parallel with the surface of the substrate W, the x- and y-direction being substantially perpendicular with respect to each other. The z-direction is substantially perpendicular with respect to the x- and y-direction, so $R_z$ represents a rotation in the xy-plane about the z-axis. A more detailed description of this is provided in EP 0 906 590 B1. A second sensor, usually referred to as the level sensor, measures the height of the surface in dependence on locations on the substrate W to be exposed, creating a height map and based on the determined heights, also determines the rotations about the x and y-axis: $R_x$, $R_y$. In one embodiment of the invention, the level sensor may include a plurality of sensing light beams, for instance eight, that are projected to the surface of the substrate W, creating several, (e.g. eight) sensing spots. The sensing spots may, for instance, be arranged in two rows of four sensing spots. The reflection of the projected sensing spots can be measured by a detector. The position of the reflected sensing spots with respect to the sensor may provide information about the height profile of the substrate surface. A more detailed description of this is provided in U.S. Pat. No. 6,674, 510 B1.

To determine the relative position of the substrate W and the substrate table WT, the lens interferometer markers IW1, IW2 on the substrate level may be used, but it is also possible to use other alignment markers, of which the position with respect to the lens interferometer alignment markers IW1, IW2 are known.

b) Move Substrate Stage WT to the Second Position

Then, when the relative position of the substrate W with respect to the substrate table WT is known, the substrate table WT, with the substrate W positioned on it, is moved to the second position, i.e., where the first position is the measurement position and the second position is the exposure position. In case a single stage machine is used, action b) is omitted.

When the substrate table WT is moved from the first position to the second position, it may be desirable to perform additional measurements. This may be due, e.g., to the use of different position sensors IF (e.g. an interferometric device as shown in FIG. 1, not shown in FIG. 4) measuring the position of the substrate table WT in the x- and y-direction at the second position, than at the first position.

c) Align Substrate Table WT with Respect to Teticle Table MT

Next, the relative position of the substrate table WT and the reticle table MT are measured according to the method as described above with reference to FIG. 3. The lens interferometer provides information about the lens aberrations, which is used to obtain accurate information about the relative position of the reticle table MT and the substrate table WT. Alternatively, the position of at least one of the tables may be measured relative to another reference position (e.g. a point or surface of the frame of the apparatus, of the projection lens, etc.).

It is preferred to use a minimum amount of measurement points, i.e. lens interferometer markers, in order to be quick. In fact, even a zero-point alignment is possible in case the reticle table control and the substrate table control have absolute relative positions, that are known, and which are stable with respect to each other. In this case the mutual positions and rotations are fixed.

One-point alignment is possible in case the reticle table MT and the substrate table WT drift with respect to each other, as is schematically depicted in FIG. 6a. In this case the tilt remains fixed and the position needs to be re-calibrated.

Figure 6B:
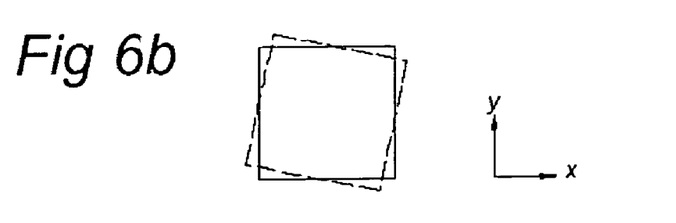
Figure 6C:
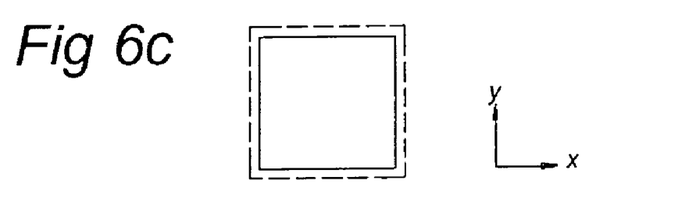
Figure 6D:
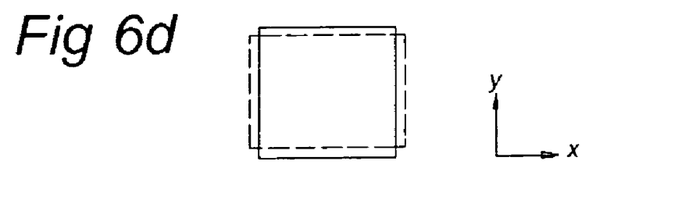
Figure 6E:
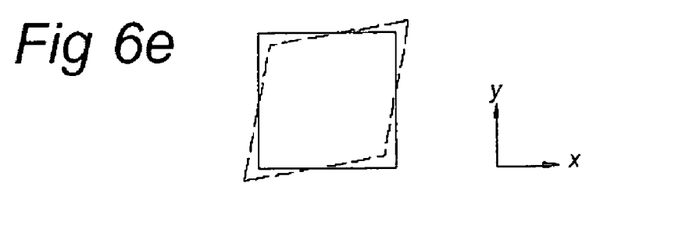

Two-point alignment is used to determine translation, lens magnification, rotation (Rz), defocus and a first focus tilt (Ry). Rotation and magnification are schematically depicted in FIGS. 6b and 6c.

Adding a third point by moving the reticle table MT, asymmetrical magnification and rotation and the second focus tilt (Rx) are also obtained. The other focus tilt (Rx) and the asymmetric magnification and rotation, are respectively schematically depicted in FIGS. 6d and 6e. More points can be used e.g. for reasons of redundancy.

d) Align Reticle MA with Respect to Reticle Table MT

Finally, the relative position of the reticle MA with respect to the reticle table MT is measured. Various ways to measure this relative position could be used, for instance, a measurement using TIS markers could be used.

The reticle MA as shown in FIG. 4 is provided with reticle alignment markers M1, M2, M3, M4 and the lens interferometer alignment markers IM1 and IM2 are provided with reticle stage alignment markers MT1 and MT2. Both the reticle alignment markers M1, M2, M3, M4 and the reticle stage alignment markers IM1 and IM2 could be markers that are suitable for use in a TIS measurement system as discussed above and that is known to a person skilled in the art. The substrate table WT is further provided with a TIS sensor, as discussed above.

The alignment of the reticle MA with respect to the reticle table MT could be performed by first aligning the reticle alignment markers M1, M2, M3, M4 with respect to the TIS sensor at the substrate table WT and secondly aligning the reticle stage alignment markers IM1 and IM2 with respect to the TIS sensor at the substrate table WT. By subsequently aligning the reticle alignment markers M1, M2, M3, M4 and the reticle stage alignment markers IM1, IM2 with respect to the TIS sensor and by measuring the movement of the mask table MT ($\Delta x$, $\Delta y$), for instance using the positioning device PW discussed above, the relative position of the reticle alignment markers M1, M2, M3, M4 and the reticle stage alignment markers IM1, IM2 can be determined.

This allows accurate alignment of the reticle MA with respect to the reticle table MT. Despite the fact that this alignment action uses the TIS sensor and the lens PL, it will be appreciated that this method may avoid errors and disadvantages as discussed above. For example, an error made by the lens will be made twice, i.e. by aligning the reticle stage alignment markers IM1 and IM2 and the reticle alignment markers M1, M2, M3, M4 with respect to the TIS sensor, and therefore, cancels out.

However, the alignment of the reticle MA with respect to the reticle table MT could also be done in different ways, for instance, the alignment could be performed completely at the reticle level. This has the advantage that such an alignment will be more accurate and cheaper, since at the reticle level, objects are larger than at the substrate level. A similar technique can be used for this alignment as is used to align the substrate W with respect to the substrate table WT, as will be understood by a person skilled in the art. In most cases a simple XY-alignment may be used for this, since alignment in the z-direction is mechanically accomplished by the specific design of the reticle stage and the reticle: the positioning of the pattern of the reticle and the supporting elements of the reticle table.

It will be understood that the actions do not necessarily have to be performed in the presented order. For instance, action d) could be performed any time after loading of the reticle MA and before exposure. Actions a) and d) may be performed simultaneously. Also, action a) may be performed during the exposure of a previous substrate W, in case a dual stage machine is used.

However, a specific order of performing the actions may be preferred. For instance, it may be preferred to first perform actions a) and d), since this provides information about the magnification between the reticle level and the substrate level. This information is used to set the lens magnification and synchronize of the movements of the substrate table WT with respect to the reticle table MT. Setting this parameters prior to performing action c) provides more accurate results.

In case a single stage machine is used, these actions can be performed at the exposure position, and action b) can be omitted.

It may be desirable to perform actions a) and d) at least at three points on the substrate W and reticle MA, which points are preferably separated by relatively large distances. For example, this may be required in order to measure the position (x, y and z), tilts ($R_x$, $R_y$, $R_z$) and substrate/reticle magnification and anamorphism (asymmetric magnification and asymmetric rotation).

Usually a number of substrates W are subjected to exposure using one and the same reticle MA. Since action d) is only concerned with the alignment of the reticle MA with respect to the reticle stage MT, action d) may be performed only after loading of a new reticle MA on the reticle stage MT, rather than before each exposure.

Since action c) (the lens interferometer measurement) may be a rather time-consuming action, also a different method could be carried out. According to this method, the lens interferometer alignment is only performed at regular time intervals, while for most substrates W the TIS measurement is used. The lens interferometer alignment may for instance be carried out once for one (e.g. the first) substrate W of a batch. Also a TIS measurement is carried out for this first substrate W. The method is based on the fact that after a first substrate W an error $\Delta$ of the TIS measurement could be determined by comparing the TIS and the lens interferometer measurement. It will be understood that the relative position of the TIS marks and the lens interferometer markers on reticle and substrate level should be known. Once the error $\Delta$ of the TIS is determined, for instance computed by the processor 20 and stored in memory device 21, the alignment can be adjusted in order to compensate for the error $\Delta$. The error $\Delta$ is stored in the memory device 21. The subsequent substrates W of the same batch can now be aligned using the TIS measurement and the previously determined error $\Delta$ between the TIS and the lens interferometer alignment.

Note that the error $\Delta$ is also influenced by the illumination mode used. Changing the illumination mode may influence the diffraction pattern and also the sensitivity to lens aberrations, as will be understood by a person skilled in the art. The sensitivities are defined as the change of the aligned position (i.e. displacement in all directions (x, y, z)) of the imaged lithographic pattern as a function of the lens aberrations.

It will be understood that the value of the error $\Delta$ may not remain valid under all circumstances. For instance, after changing the reticle MA it is recommended to perform an additional lens interferometer alignment and determine the error $\Delta$ again. Also, the error A could be determined on regular time intervals in order to take into account changing machine characteristics, for instance as a result of heating of the machine parts. Also, in case the mode of illumination is changed, i.e. the angular intensity distribution of the beam is changed by using the adjusting structure AM of the illuminator IL, a new lens interferometer alignment could be performed.

Once the sensitivities are known for a certain illumination mode, according to an alternative, data representing these sensitivities can be recorded in the pattern provided on the reticle MA. The lithographic machine is arranged to read this data from the reticle MA and use it in combination with the lens aberrations determined by the lens interferometer to compute the aligned position. A reading device for reading this information from the patterning structure and a computation device for computing the aligned position may be provided in this alternative (not shown). This allows a quick and relatively easy procedure for replacing a reticle MA with another reticle MA.

It will be understood that some or even all of the actions described above may be carried out by a processor 20, as is schematically depicted in FIG. 4. The processor 20 is arranged to receive the measured data from the measurement devices used to perform the method as described above. The data that is obtained as a result of the measurements may be stored in the memory device 21 as schematically depicted in FIG. 4.

Figure 5:
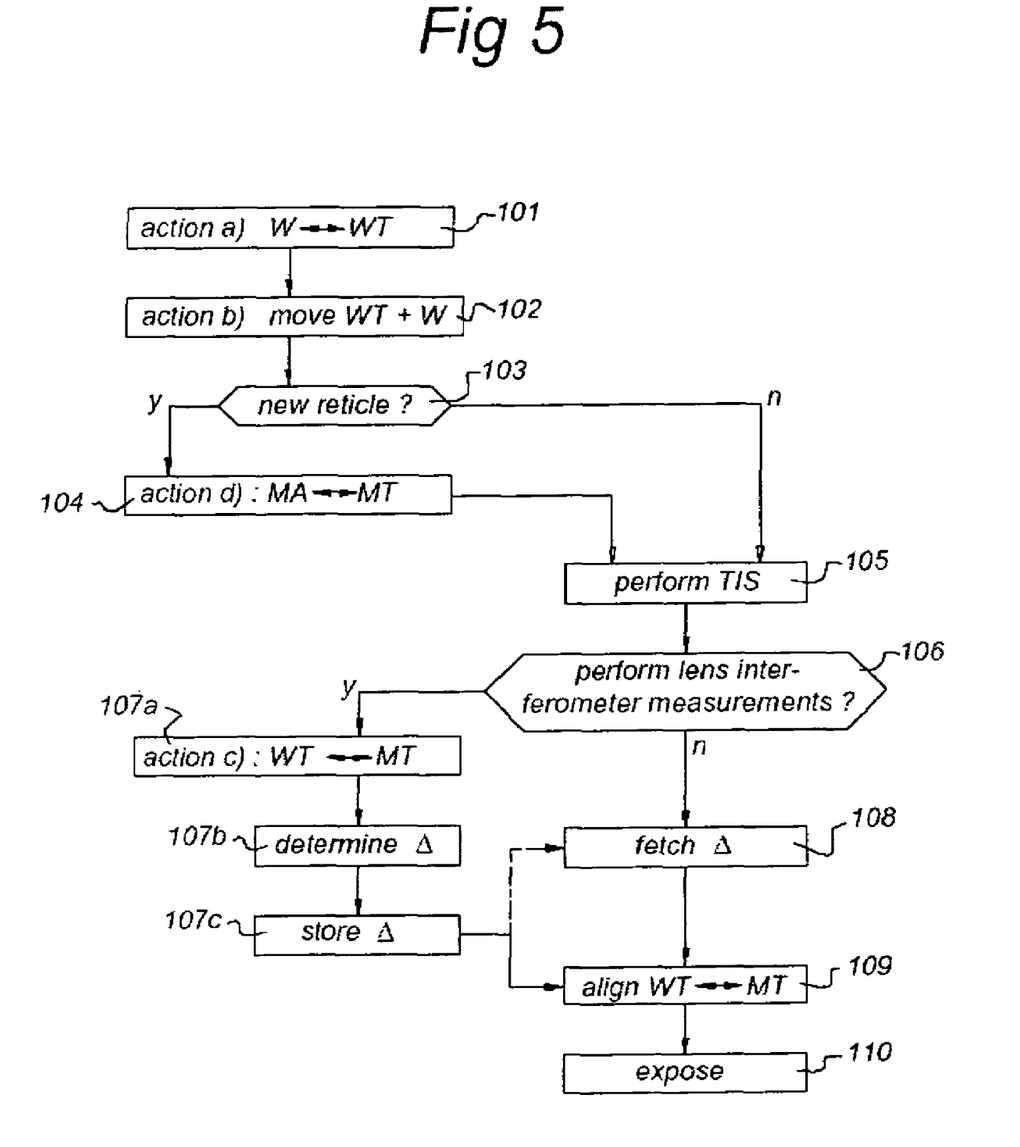
FIG. 5 shows a flow diagram representing a method according to an embodiment of the invention.

FIG. 5 shows a method for performing alignment according to an embodiment of the invention. First in action 101 action a) is performed, in which the substrate W is aligned with respect to the substrate table WT at a first position. Next, in action 102 action b) is performed in which the substrate table WT and the substrate W are moved to the exposure position. Action a) and b) may be performed as described above.

Then, in a next action 103, it is determined if a new reticle MA is used. In case the reticle MA is 'old', for instance if it was used for the previous exposure, this means that the relative position of the reticle MA with respect to the reticle table MT is already known. In that case the answer to action 103 is no, indicated with a N in FIG. 5. In this case the relative position of the reticle MA with respect to the reticle table MT could for instance be retrieved from memory device 21.

If the relative position of the reticle MA with respect to the reticle table MT is not known from a previous exposure, i.e. the relative position of the reticle MA with respect to the reticle table MT has not yet been recorded, this means that a so-called 'new' reticle MA is used (see Y in FIG. 5 after action 103), and first action 104 is carried out, in which the reticle MA and the reticle table MT are aligned with respect to each other, as described above with reference to action d). This relative position might be stored in memory device 21 for use during a next exposure.

Next, at action 105, a TIS measurement is performed, as is known from the prior art. The TIS measurement could be carried out by using the TIS alignment markers that are provided on the reticle MA (mask alignment marker M1, see FIG. 2), but may also be carried out by using TIS alignment markers provided on the reticle stage MT (reticle stage alignment marker IM, see FIG. 4), as long as the relative position of the TIS alignment markers with respect to the lens interferometer markers IM1, IM2 is fixed.

After this action it is determined in action 106 whether or not a lens interferometer alignment should be performed. If, for instance, the error Δ of the TIS measurement with respect to the lens interferometer measurement is already known, no lens interferometer measurement is necessary. In this case, the method proceeds with action 108. If this error Δ is not known, or is no longer valid, for reasons described above, a lens interferometer alignment action is performed and the method proceeds with actions 107a-c.

According to action 107a a lens interferometer alignment is performed using the lens interferometer, as described above. Based on the results of action 107a, the error Δ between the TIS measurement and the lens interferometer measurement can be determined in action 107b. Next, the determined error Δ is stored at the memory device 21 in action 107c.

If no lens interferometer measurement is necessary, the method proceeds after action 106 with action 108, in which a previously obtained error Δ is retrieved from memory device 21, in which the error Δ is stored. In action 109 the substrate table WT is actually aligned with respect to the reticle table MT using the TIS measurement from action 105 and the error Δ.

The exposure of the substrate W is finally carried out in action 110.

It will be understood that the invention as described above may also be carried out by using any other measurement device that is capable of determining the lens aberrations. In general, other common path interferometers can be used, such as a point diffraction interferometer and a Burch's interferometer.

The point diffraction interferometer also works as an alignment sensor, but does not need a diffuser. The spherical wave front is created by a pinhole at reticle level. This results in an aberrated wave front at the substrate level. At the substrate level a second pinhole is created in the vicinity of the convergence point of the first pinhole.

The Burch's interferometer uses two scattering plates and coherent light.

Embodiments of the present invention include a method for aligning at least one first alignment marker with respect to at least one second alignment marker, where a lens is positioned in between the at least one first alignment marker and the at least one second alignment marker. The method comprises providing an alignment beam, imaging the at least one first alignment marker on the at least one second alignment marker with the alignment beam through the lens, providing a lens interferometer as a measurement device arranged to measure a relative position of said at least one second alignment marker relative to the at least one first alignment marker, measuring the relative position, and aligning the position of at least one of the first alignment markers and the second alignment markers based on the measured relative position. By using a lens interferometer, the lens aberrations are measured. Instead of using only image displacement, other distortions are measured and can thus be taken into account.

According to another embodiment of the invention, the alignment of the relative position is based on the lowest order Zernike polynomials. These lowest order Zernike polynomials can easily be determined and provide adequate information about the relative alignment of the markers.

According to a further embodiment of the invention, the at least one first alignment marker is positioned on a reticle. This is a possible position for the at least one first alignment marker, that allows direct alignment of the reticle with respect to for instance the substrate or substrate table.

According to a further embodiment of the invention, the at least one first alignment marker is positioned on a reticle table, arranged to support a reticle, and the reticle is provided with at least one reticle alignment marker, and the alignment method further comprises aligning the at least one reticle alignment marker with respect to the at least one first alignment marker. Since the at least one alignment marker to be used according to the invention can not always be positioned on the reticle, it may also advantageously be positioned on the reticle table. In that case, an additional alignment step may be desirable, i.e. the aligning of the reticle with respect to the reticle table.

According to a further embodiment of the invention, the at least one second alignment marker is positioned on a substrate. This may be implemented to allow quick and direct alignment of the substrate.

According to a further embodiment of the invention, the at least one second alignment marker is positioned on a substrate table, arranged to support a substrate, and the substrate is provided with at least one substrate alignment marker, and the alignment method further comprises: aligning the at least one substrate alignment marker with respect to the at least one second alignment marker. In case the at least one second alignment marker can not be provided on the substrate, it may be provided on the substrate table. In that case, an additional alignment step may be desirable for aligning the substrate with respect to the substrate table.

According to a further embodiment of the invention, the lens interferometer is a lateral shearing interferometer. This is an easy and well-known interferometer.

According to a further embodiment of the invention, a frosted glass is provided, close to the first alignment markers, or in a conjugate field plane thereof, such that the alignment beam is first guided through the frosted glass before it reaches the at least one first alignment marker. The frosted glass may be sued to provide the whole pupil plane with light, e.g. in order to determine the phase at all positions in the pupil plane.

A device manufacturing method according to another embodiment comprises providing a substrate; providing a projection beam of radiation using an illumination system; using patterning structure to impart the projection beam with a pattern in its cross-section; projecting the patterned beam of radiation onto a target portion of the substrate, and aligning the substrate with respect to the patterning structure, by performing a method as described herein.

According to another embodiment, a system for aligning at least one first alignment marker with respect to at least one second alignment marker comprises a lens positioned in between the at least first alignment marker and the at least one second alignment marker, the system being arranged to provide an alignment beam to image the at least one first alignment marker through the lens on the at least one second alignment marker, the system further comprising a measurement device arranged to measure a relative position of said at least one first alignment marker relative to said at least one second alignment marker, where the measurement device is a lens interferometer and the system is further arranged to measure the relative position using the interferometer and align the position of at least one of the first alignment markers and the second alignment markers based on the measured relative position.

Such a system may comprise a processor and a memory device, the processor being arranged to communicate with the measurement device to obtain the aligned position and to store the aligned position in the memory device.

A lithographic apparatus according to another embodiment comprises an illumination system for providing a projection beam of radiation; a support structure for supporting patterning structure, the patterning structure serving to impart the projection beam with a pattern in its cross-section; a substrate table for holding a substrate; and a projection system for projecting the patterned beam onto a target portion of the substrate, where the lithographic apparatus further comprises a system as described above.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The description is not intended to limit the invention. The scope of the invention is to be determined only by the appended claims.

What is claimed is:

1. A method of aligning a first alignment marker with respect to a second alignment marker, the method comprising:
    using an alignment beam and a lens positioned in a path of the alignment beam between the first alignment marker and the second alignment marker, imaging the first alignment marker on the second alignment marker;
    using a lateral shearing lens interferometer to measure a position of the second alignment marker relative to the first alignment marker; and
    based on the measured relative position, aligning a position of at least one of the first and second alignment markers.

2. The method of aligning according to claim 1, where said aligning is based on at least one low-order term of a Zernike polynomial expression corresponding to the lens.

3. The method of aligning according to claim 1, where the first alignment marker is positioned on a reticle.

4. The method of aligning according to claim 1, wherein the first alignment marker is positioned on a reticle table arranged to support a reticle, and wherein the reticle is provided with a reticle alignment marker, said method comprising:
    aligning the reticle alignment marker with respect to the first alignment marker.

5. The method of aligning according to claim 1, where the second alignment marker is positioned on a substrate.

6. The method of aligning according to claim 1, wherein the second alignment marker is positioned on a substrate table arranged to support a substrate, and wherein the substrate is provided with a substrate alignment marker, said method comprising:
    aligning the substrate alignment marker with respect to the second alignment marker.

7. The method of aligning according to claim 1, wherein a diffuser is provided in a path of the alignment beam before the beam reaches the first alignment marker.

8. The method of aligning according to claim 7, wherein the diffuser comprises frosted glass.

9. The method of aligning according to claim 7, wherein the diffuser is positioned in a conjugate field plane of the first alignment marker.

10. The method of aligning according to claim 1, said method comprising:
    using the lateral shearing lens interferometer, obtaining information regarding at least one aberration of the lens;
    obtaining data representing a sensitivity of a position of a patterning structure to said at least one lens aberration; and
    based on the information and the data, aligning a position of the patterning structure.

11. The method of aligning according to claim 10, wherein said obtaining data comprises reading data that represents a sensitivity of a position of a patterning structure to said at least one lens aberration and is recorded in the patterning structure.

12. The method of aligning according to claim 10, said method comprising using the lens to image a pattern of the patterning structure on a radiation-sensitive portion of a substrate.

13. The method of aligning according to claim 1, said method comprising manufacturing a device, said manufacturing including:
    aligning a substrate with respect to a patterning structure;
    using the patterning structure to impart a beam of radiation with a pattern in its cross-section; and
    projecting the patterned beam of radiation onto a target portion of the substrate,
    wherein said aligning a substrate includes said aligning a position of at least one of the first and second alignment markers.

14. The method of aligning according to claim 1, said method comprising:
    using an alignment beam and the lens, imaging a third alignment marker onto the second alignment marker; and
    using a lateral shearing lens interferometer to measure a position of the second alignment marker relative to the third alignment marker.

15. The method of aligning according to claim 1, said method comprising:
    using an alignment beam and the lens, imaging the first alignment marker onto a third alignment marker; and
    using a lateral shearing lens interferometer to measure a position of the third alignment marker relative to the first alignment marker.

16. A system for aligning a first alignment marker with respect to a second alignment marker, the system comprising:
    a lens arranged to image the first alignment marker on the second alignment marker, said lens being positioned in a path of an alignment beam between the first alignment marker and the second alignment marker;
    a lateral shearing lens interferometer arranged to measure a position of the first alignment marker relative to the second alignment marker; and
    a control system arranged to align a position of at least one of the first and second alignment markers based on the measured relative position.

17. The system for aligning according to claim 16, said control system comprising:
    a memory device; and
    a processor arranged to communicate with the lateral shearing lens interferometer and to store the aligned position in the memory device.

18. The system for aligning according to claim 16, wherein the lateral shearing lens interferometer is configured to obtain information regarding at least one aberration of the lens, and wherein said control system is configured to obtain data representing a sensitivity of a position of a patterning structure to said at least one aberration and to align a position of the patterning structure based on the information and the data.

19. The system for aligning according to claim 18, wherein said lens is configured to image a pattern of the patterning structure on a radiation-sensitive portion of a substrate.

20. The system for aligning according to claim 18, wherein said control system is configured to read data that represents a sensitivity of a position of a patterning structure to said at least one aberration and is recorded in the patterning structure.

21. The system for aligning according to claim 20, wherein said control system comprises:

a sensor configured to read the data recorded in the patterning structure; and a processor configured to compute the aligned position of the patterning structure based on the information and the data.

22. The system for aligning according to claim 16, said system comprising:

a support structure configured to support patterning structure, the patterning structure serving to impart a beam of radiation with a pattern in its cross-section;

a substrate table configured to hold a substrate; and a projection system configured to project the patterned beam onto a target portion of the substrate, wherein the control system is configured to align a position of the patterning structure based on the measured relative position.

23. A method of aligning, the method comprising:
illuminating a first alignment marker with a beam;
using a lens to project light of the beam outgoing from the first alignment marker onto a second alignment marker;
obtaining information regarding at least one aberration of the lens from light of the beam outgoing from the second alignment marker; and based on the information, measuring a position of at least one of the first and second alignment markers with respect to the other.

24. The method of aligning according to claim 23, said method comprising aligning at least one of the first and second alignment markers with respect to a reference position.

25. The method of aligning according to claim 23, wherein said obtaining information includes obtaining information regarding at least one aberration of the lens from interference of the light of the beam outgoing from the second alignment marker.

26. The method of aligning according to claim 23, wherein said obtaining information includes obtaining information regarding at least one term of a Zernike polynomial corresponding to the lens from the light of the beam outgoing from the second alignment marker.

27. The method of aligning according to claim 23, wherein said obtaining information includes determining the at least one aberration using a common path interferometer.

28. The method of aligning according to claim 23, wherein said illuminating a first alignment marker with a beam comprises illuminating the first alignment marker with a diffused beam.

29. The method of aligning according to claim 23, said method comprising:

obtaining data representing a sensitivity of a position of a patterning structure to said at least one lens aberration; and based on the information and the data, aligning a position of the patterning structure with respect to at least one of the first and second alignment markers.

30. The method of aligning according to claim 29, said method comprising using the lens to image a pattern of the patterning structure on a radiation-sensitive portion of a substrate.

* * * * *